US010044271B1

(12) United States Patent
Assaad et al.

(10) Patent No.: US 10,044,271 B1
(45) Date of Patent: Aug. 7, 2018

(54) METHODS AND APPARATUS FOR DC-DC SOFT START

(71) Applicant: TEXAS INSTRUMENTS INCORPORATED, Dallas, TX (US)

(72) Inventors: Rida Shawky Assaad, Murphy, TX (US); David Wayne Evans, Bentonville, AR (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/581,747

(22) Filed: Apr. 28, 2017

(51) Int. Cl.
| | |
|---|---|
| *H02M 1/36* | (2007.01) |
| *H02M 3/158* | (2006.01) |
| *H03K 4/06* | (2006.01) |
| *H03K 5/00* | (2006.01) |

(52) U.S. Cl.
CPC ............ *H02M 3/158* (2013.01); *H02M 1/36* (2013.01); *H03K 4/06* (2013.01); *H03K 5/00006* (2013.01)

(58) Field of Classification Search
CPC .......... H02M 3/158; H02M 1/36; H03K 4/06; H03K 5/00006
See application file for complete search history.

(56) References Cited

U.S. PATENT DOCUMENTS

| | | | | |
|---|---|---|---|---|
| 2006/0038547 A1* | 2/2006 | Ahmad | .................... | H02M 1/08 323/284 |
| 2009/0322299 A1* | 12/2009 | Michishita | ............ | H02M 3/156 323/282 |
| 2011/0133711 A1* | 6/2011 | Murakami | ......... | H03K 17/0822 323/282 |
| 2012/0242314 A1* | 9/2012 | Namekawa | .............. | H03K 7/08 323/283 |
| 2015/0077078 A1* | 3/2015 | Hsu | ........................ | H02M 3/156 323/282 |
| 2016/0118881 A1* | 4/2016 | Schmitz | ................ | H02M 3/156 323/271 |
| 2017/0077816 A1* | 3/2017 | Satterfield | ............. | H02M 3/158 |

\* cited by examiner

*Primary Examiner* — Fred E Finch, III
*Assistant Examiner* — Demetries A Gibson
(74) *Attorney, Agent, or Firm* — Michael A. Davis, Jr.; Charles A. Brill; Frank D. Cimino

(57) ABSTRACT

Methods and apparatus for DC-DC soft start are disclosed herein, an example DC-DC voltage converter includes at least two transistors to at least charge or discharge an inductor from an input source and to ground respectively, the inductor to output an output voltage. A synchronize and track circuit generates a bias current based on a reference voltage. An amplifier generates an error current based on an output voltage and the reference voltage. An oscillator oscillates at a switching frequency based on the bias current and the error current. A multiplexer selects between (1) a first input signal generated based on the switching frequency, and (2) a second input signal generated based on the switching frequency and the error current, for output as a reset signal. A latch provides a control signal to the at least two transistors based on the reset signal and the switching frequency.

16 Claims, 6 Drawing Sheets

METHODS AND APPARATUS FOR DC-DC SOFT START

BACKGROUND

A Direct Current (DC) to DC converter converts an input voltage level to an output voltage level. DC to DC converters are commonly used in consumer electronics devices (e.g., smart phones, tablets, laptop computers, etc.) and/or other battery-operated devices. Such electronic devices often include different components that may require different input voltages. DC-DC converters enable conversion from an input voltage (e.g., a voltage supplied from a battery or an external power source) to an output voltage used by a component of the electronic device.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Switching DC-DC converters convert an input DC voltage of a first level to an output DC voltage of a second level. In some examples, the output voltage is greater than the input voltage (e.g., a step up), while in some examples the output voltage is less than the input voltage (e.g., a step down). Switching DC-DC converters achieve the voltage change by temporarily storing and then releasing energy to the output. In examples disclosed herein, energy is stored in an inductor. However, any other energy storage component may additionally or alternatively be used. In some examples, during startup, a large inrush current to or from the energy storage might be experienced, potentially causing damage to components of the DC-DC converter, excessively draining a battery supplying the input voltage, etc.

The ability to provide a controlled soft-startup in a DC-DC converter (e.g., a switching power supply) is a critical requirement for inrush current control and output overshoot and settling. Controlling inductor inrush current reduces instantaneous drains on an input power supply and helps prevent inductor saturation. With tightly controlled inrush current, system designers are allowed to choose inductors and input decoupling capacitors without the need for inrush margin, reducing system volume and cost. Another advantage of controlled soft-startup can also be seen in the reduction of output voltage overshoot and settling. Yet another advantage of controlled soft-start is the ability to provide a deterministic settling time of the power supply regardless of loading or external component variations. Example approaches disclosed herein enable soft-start control in a DC-DC converter, while also offering a solution to common startup problems found in Multi-level DC-DC converter architectures.

Figure 1:
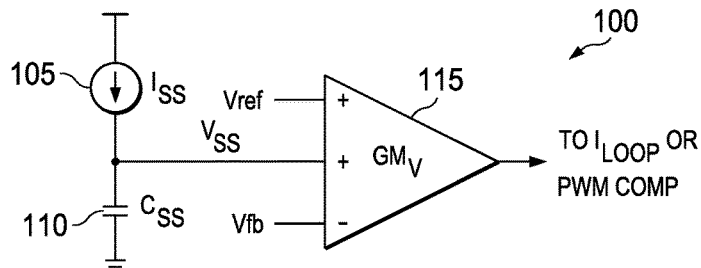
FIG. 1 is a circuit diagram depicting an example approach to controlling the startup of a DC-DC converter.
Figure 2:
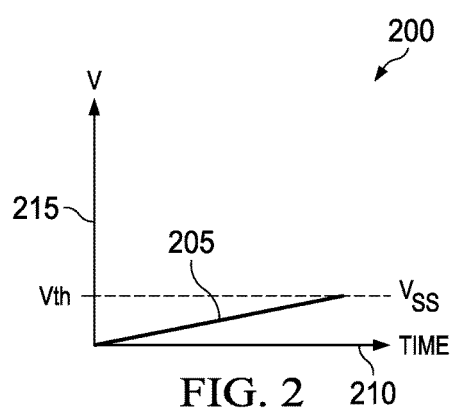
FIG. 2 is a voltage diagram representing a voltage level stored at the capacitor of the circuit of FIG. 1.

FIG. 1 is a circuit diagram 100 depicting a known example approach to controlling a DC-DC converter startup. The example circuit 100 of FIG. 1 includes a current source 105, a capacitor 110, and an amplifier 115. A current provided by the current source 105 linearly charges the capacitor 110. FIG. 2 is a voltage diagram 200 representing a voltage level 205 stored at the capacitor 110 of the circuit 100 of FIG. 1 during the linear charging of the capacitor 110. The example voltage diagram 200 includes a horizontal axis 210 representing time, and a vertical axis 215 representing voltage.

The voltage 205 across the capacitor 110 is input to the amplifier 115. In the illustrated example of FIG. 1, the amplifier 115 is a Voltage Loop Error Amplifier including a three-limb differential pair. The amplifier 115 drives an error voltage signal to gradually increase or decrease a duty cycle of another circuit (e.g., a pulse width modulation (PWM) circuit, a current loop circuit) to reach a steady state output voltage value.

The example capacitor 110 of FIG. 1 may be internal or external to a package (e.g., a die) of the example circuit 100 of FIG. 1. If the capacitor 110 is implemented externally with respect to the package, the package of the example circuit 100 might utilize an additional pin (to facilitate the connection of the capacitor 110), which increases an amount of space required by the package (and the capacitor) on a circuit board carrying the circuit 100. If the capacitor 110 is implemented internally with respect to the package, a smaller capacitor and/or capacitance value is typically used to facilitate reduction of the package size. A correspondingly small current is output by the current source 105 which, at low values, can be inaccurate and/or difficult to control. Such control is made even more difficult when operated at high temperatures. Moreover, packaging constraints make it difficult to design a circuit that provides soft-start times in excess of 1 millisecond (ms).

Figure 3:
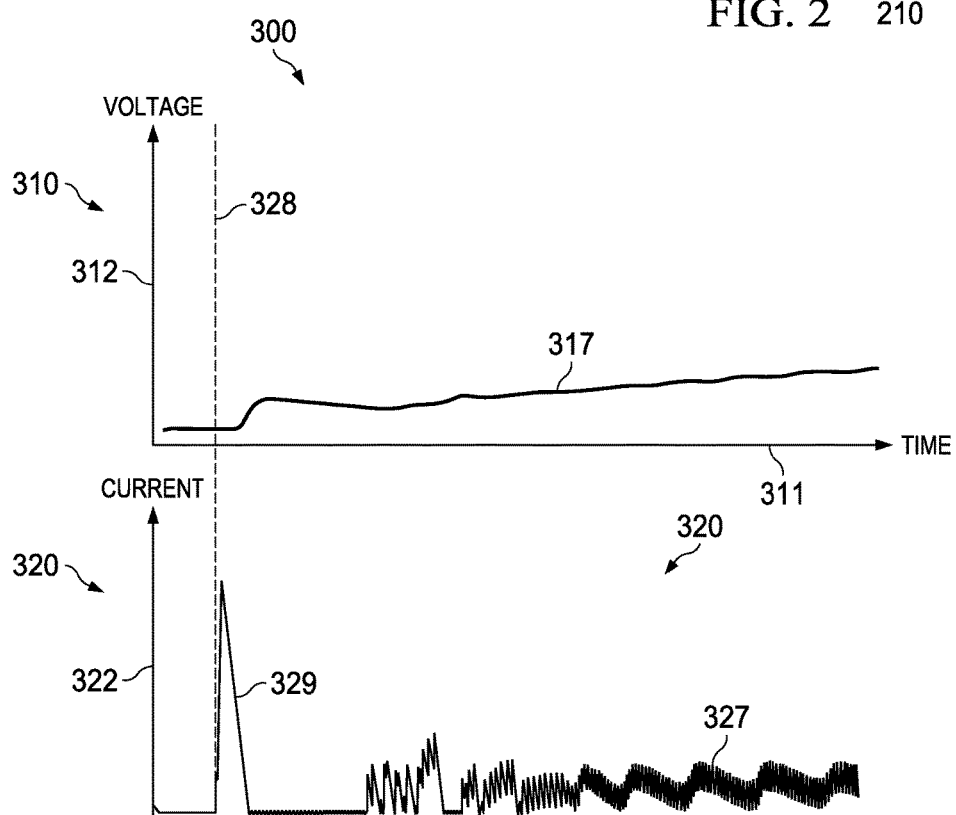
FIG. 3 is a voltage and current timing diagram representing changes in an output voltage of a DC-DC converter and an inductor current of an inductor of the DC-DC converter utilizing the example approach to controlling the startup of the DC-DC converter of FIG. 1 during startup of the DC-DC converter.

FIG. 3 is a voltage and current timing diagram 300 representing changes in an output voltage and output current of a DC-DC converter, utilizing the example approach to controlling the DC-DC converter of FIG. 1 during startup of the DC-DC converter. A voltage diagram 310 includes a horizontal axis 311 representing time, and a vertical axis 312 representing voltage. The voltage diagram 310 represents an output voltage 317 of the DC-DC converter. An output current diagram 320 includes the horizontal axis 311 representing time (which is vertically aligned with the voltage diagram 310), and a vertical axis 322 representing current. The current diagram 320 represents a current 327 output by the DC-DC converter using existing soft-start techniques. As shown in the illustrated example of FIG. 3, when the soft-start process is started (vertical line 328), a large inrush current 329 is experienced at the output of the DC-DC converter. As noted above, this large inrush current might cause damage to components of the DC-DC converter, might excessively drain a battery supplying an input voltage to the DC-DC converter, etc.

Figure 4:
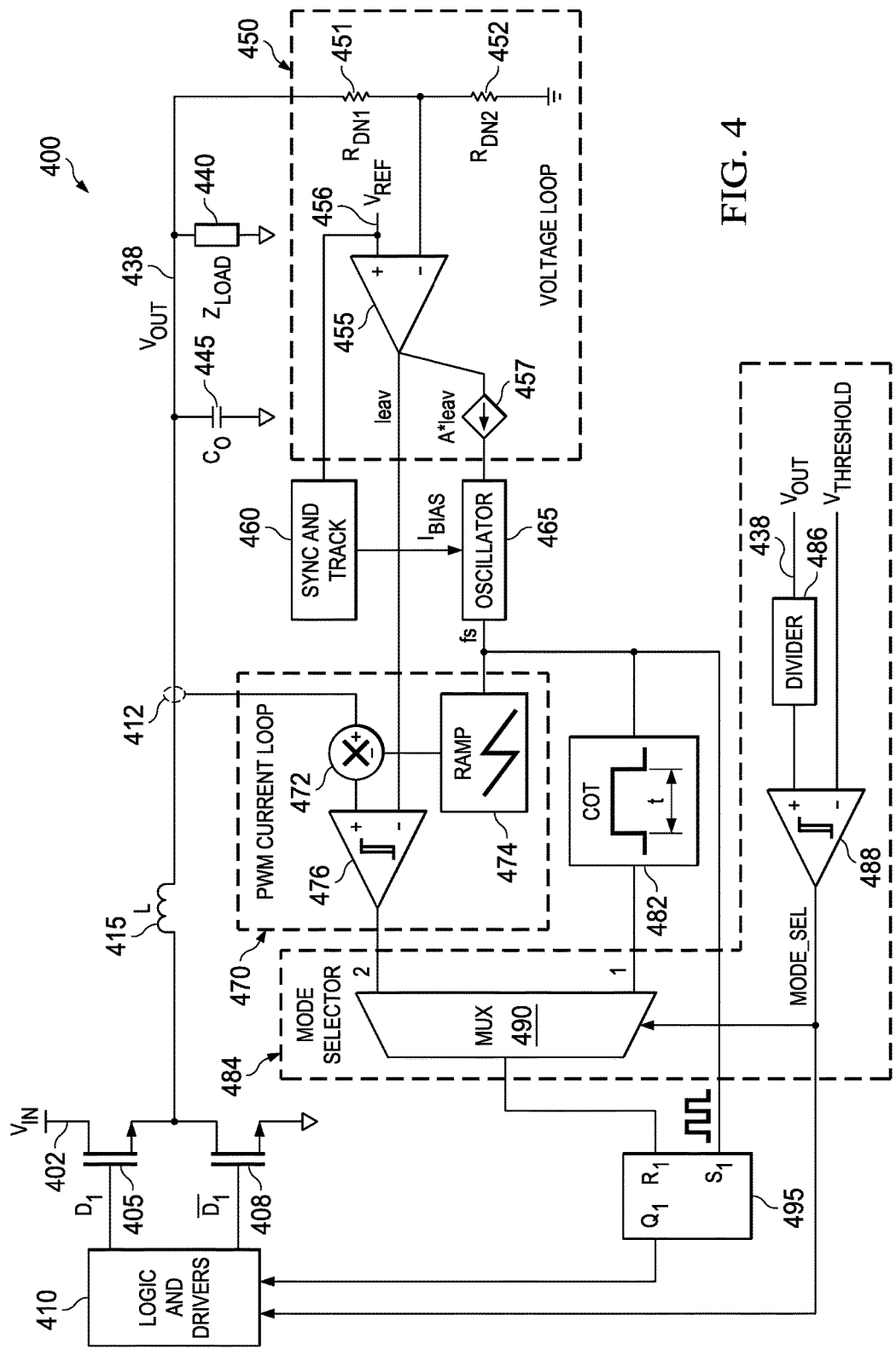
FIG. 4 is a circuit diagram of an example DC-DC converter providing a soft-start.

FIG. 4 is a circuit diagram of an example DC-DC converter 400 providing a soft-start. The example DC-DC converter 400 of the illustrated example of FIG. 4 represents an example implementation of a two level soft start DC-DC converter. An example implementation of an N level soft start DC-DC converter is described below in connection with FIG. 8. The example circuit 400 of FIG. 4 receives an input voltage 402 to be converted to another DC voltage (e.g., to an output voltage $V_{OUT}$ 438). To control the output voltage, switching of a first transistor 405 and a second transistor 408 is controlled by a logic and driver circuit 410. An output of the first transistor 405 and the second transistor 408 is applied to an inductor 415. The inductor 415 outputs an output voltage 438 which is applied to a load 440 and a capacitor 445. Current output by the inductor 415 is measured by a current sensor 412. The measured current is used as an input to a pulse width modulated current loop 419. The output voltage 438 is connected to a voltage loop 450. The example voltage loop 450 includes a first resistor 451, a second resistor 452, a first amplifier 455, and a second amplifier 457. The example DC-DC converter 400 further includes a synchronize and track circuit 460, an oscillator 465, a pulse width modulation current loop 470, a constant on-time generator 482, a mode selector 484, and a latch 495.

The example first transistor 405 of the illustrated example of FIG. 4 is implemented by an N-channel metal oxide semiconductor field effect transistor (MOSFET). However, any other type of transistor may additionally or alternatively be used. A first terminal (e.g., a drain terminal) of the example first transistor 405 is connected to the voltage input 402. A second terminal (e.g., a gate terminal) of the example first transistor 405 receives an input from the logic and drivers circuitry 410. A third terminal (e.g., a source terminal) of the example first transistor 405 is connected to a first terminal of the inductor 415 and a first terminal of the second example transistor 408.

The example second transistor 408 of the illustrated example of FIG. 4 is implemented by an N-channel MOSFET. However, any other type of transistor may additionally or alternatively be used. A first terminal (e.g., a drain terminal) of the second example transistor 408 is connected to the first terminal of the inductor 415 and the third terminal of the first example transistor 405. A second terminal (e.g., a gate terminal) of the example second transistor 408 receives an input from the logic and drivers circuitry 410. A third terminal (e.g., a source terminal) of the second example transistor 408 is connected to ground. In the illustrated example of FIG. 4, the first transistor 405 and the second transistor 408 are arranged in a buck converter arrangement. However, any other transistor arrangement and/or topology may additionally or alternatively be used.

The example logic and driver circuitry 410 of the illustrated example of FIG. 4 receives inputs from the latch 495 and the mode selector 484. The example logic and drivers circuitry 410 outputs a first control signal to the second terminal of the first example transistor 405, and outputs a second control signal to the second terminal of the second example transistor 408. In examples disclosed herein, the logic and drivers 410 converts a control signal provided by an example latch 495 to levels appropriate for controlling the operation of the first example transistor 405 and the second example transistor 408. In some examples, the example logic and drivers 410 includes a complement generator to generate a complement of the control signal. In such an example, the control signal (e.g., $Q_1$ shown in FIG. 4) is provided as the output $D_1$ to the first example transistor, and a complement of the control signal (e.g., $\overline{Q_1}$, the complement of $Q_1$) is provided as the output $\overline{D_1}$ to the second example transistor 408. In some examples, the logic and driver circuitry 410 may provide additional functionality such as pulse shuffling, which is useful when the DC-DC converter 400 is implemented as using N levels of operation. An example implementation of the example logic and driver circuitry for use in an N level DC-DC converter implementation is disclosed further in connection with FIG. 9.

A first terminal of the inductor 415 is connected to the third terminal of the first transistor 405 and the first terminal of the second transistor 408. A second terminal of the example inductor 415 provides the output voltage 438, and is connected to the load 440, the capacitor 445, and a first terminal of the first resistor 451 of the voltage loop 450.

The output voltage 438 is supplied to the load 440 and the output capacitor 445. The load 440 may be any type of load (e.g., a capacitive load, an inductive load, a resistive load, etc.) The example output voltage 438 is also supplied to the first terminal of the first resistor 451 within the voltage loop 450. A second terminal of the first resistor 451 is connected to a first terminal of the second resistor 452 and a first input terminal of the first amplifier 455. A second terminal of the second resistor 452 is connected to ground. In effect, the first example resistor 451 and the second example resistor 452 form a resistor divider circuit.

A second input terminal of the first amplifier 455 receives a reference voltage 456. In the illustrated example of FIG. 4, the reference voltage is a ramped reference voltage (e.g., the received voltage is a function of time). In some examples, the ramped reference voltage is obtained using a trim-able RC filter that receives a desired target reference voltage, and provides a ramped soft-start reference voltage over time. However, the example reference voltage may be ramped over time in any other fashion.

The example first amplifier 455 of the illustrated example of FIG. 4 is implemented by a trans-conductance amplifier. However, any other past, present, and/or future type of amplifier may additionally or alternatively be used. The first terminal of the example first amplifier 455 is connected to the second terminal of the first example resistor 451 and the first terminal of the second example resistor 452. The second terminal of the example first amplifier 455 is connected to the reference voltage 456, and a first terminal of the synchronize and track circuit 460. The output terminal of the example first amplifier 455 is connected to a comparator 476 of the example pulse width modulated current loop 470, and to an input terminal of the second example amplifier 457.

The second example amplifier 457 of the illustrated example of FIG. 4 receives an input current (Ieav) from the output terminal of the first example amplifier 455, and provides a scaled current to the oscillator 465 (represented as A*Ieav).

The example synchronize and track circuit 460 of the illustrated example of FIG. 4 receives the reference voltage 456 and produces a biasing current (Ibias) that is output to the example oscillator 465. In examples disclosed herein, the synchronize and track circuit 460 synchronizes and references the output Ibias to the slope of the reference voltage 456 to enable the switching frequency of the first and second transistors 405, 408 to correspond to the reference voltage 456 (e.g., to gradually increase over time). Thus, the output Ibias can be thought of as a control for the oscillator that coarsely follows the reference voltage 456. An example implementation of the synchronize and track circuit 460 is described below in connection with FIG. 5.

The example oscillator 465 of the illustrated example of FIG. 4 is a relaxation oscillator, and receives an input Ibias from the synchronize and track circuit 460, and the current from the output of the second example amplifier 457 (A*Ieav). As noted above, the bias current from the synchronize and track circuit 460 follows the voltage reference 456 to gradually reach a desired switching frequency in steady-state operation. In examples disclosed herein, the example Ibias current does not reference an actual performance of the DC-DC converter (e.g., how close is the output of the converter to the desired reference voltage). To account for this, the output of the second example amplifier 457 (which is based on Ieav, which represents a difference between the reference voltage 456 and the output voltage), is used to fine tune the switching frequency of the oscillator 465. Based on Ibias received from the synchronize and track circuit 460, the oscillator outputs a frequency fs to the pulse width modulation current loop 470, the constant on-time generator 482, and the latch 495.

The example pulse width modulation current loop 470 of the illustrated example of FIG. 4 receives inputs from the current sensor 412, the first example amplifier 455, and the oscillator 465. In the illustrated example of FIG. 4, the example pulse width modulation current loop 470 includes a summing circuit 472, a ramp generator 474, and a first example comparator 476.

The example summing circuit 472 of the illustrated example of FIG. 4 receives an input from the current sensor 412 and an input from the ramp generator 474. The example summing circuit 472 outputs a value to the first example comparator 476. In the illustrated example of FIG. 4, the input from the current sensor 412 forms an isolated connection with the output voltage 438 (e.g., at the second terminal of the example inductor 415). In the illustrated example of FIG. 4, the isolated connection is an inductive connection. However, any other type(s) of isolated connection may additionally or alternatively be used.

The example ramp generator 474 receives an input from the oscillator 465 and outputs a ramped signal to the example summing circuit 472. The slope of the ramp and the time between successive ramps of the output signal generated by the example ramp generator 474 varies based on the frequency of the oscillator 465.

The example comparator 476 of the illustrated example of FIG. 4 includes a first terminal that receives an input from the example summing circuit 472. A second terminal of the example comparator 476 receives a current ($I_{eav}$) from an output of the first amplifier 455. The example comparator 476 compares the received inputs and outputs a comparison signal representative of the comparison via an output terminal. The output terminal of the example comparator 476 is connected to an input of an example multiplexer 490 of the example mode selector 484.

The example constant on-time generator 482 of the illustrated example of FIG. 4 generates a pulse having a constant pulse width at the frequency output by the oscillator 465. In examples disclosed herein, a rising edge of the oscillator output triggers a rising edge of the constant on-time generator 482. However, the constant on-time generator 482 may be triggered in any other fashion. In examples disclosed herein, the pulse width is fixed. However, in some examples, the pulse width may be adjustable (e.g., controlled as an input to the constant on-time generator 482). The output of the constant on-time generator 482 is output to the example multiplexer 490 of the example mode selector 484.

The example mode selector 484 of the illustrated example of FIG. 4 includes a divider 486, a second comparator 488, and a multiplexer 490. The example divider 486 receives the output voltage 438 and creates a scaled output voltage. The scaled output voltage enables easier setting of a voltage threshold with which the output voltage 438 will be compared. The scaled output voltage is input to the second example comparator 488. The second example comparator 488 compares the scaled output voltage to a voltage threshold. When the scaled output voltage is less than the voltage threshold, the DC-DC converter 400 is to operate in a first mode (corresponding to utilizing the constant on-time control). When the scaled output voltage is greater than or equal to the voltage threshold, the DC-DC converter 400 is to operate in a second mode different from the first mode (that corresponds to utilizing the pulse width modulated control). The output of the second example comparator 488 is passed to the multiplexer 490.

While in the illustrated example of FIG. 4, the mode selector 484 utilizes a voltage threshold to determine the mode of operation, any other approach to determining when to switch from a first mode of operation to a second mode of operation may additionally or alternatively be used. For example, a time-based threshold (e.g., a counter value reaching a threshold) may be used to determine when to switch from the first mode of operation to the second mode of operation.

The example multiplexer 490 of the illustrated example of FIG. 4 selects between a first input received from the constant on-time generator 482 and a second input received from the first example comparator 476 of the pulse width modulation current loop 470. Based on the output of the second example comparator 488, the multiplexer selects an input for output to a reset terminal of the example latch 495.

The latch 495 of the illustrated example of FIG. 4 is a set-reset latch. However, any other latch and/or combination of latching and/or logic topologies may additionally or alternatively be used. The example latch 495 includes a reset terminal that is connected to an output of the example multiplexer 490. The example latch 495 includes a set terminal that is connected to an output of the oscillator 465. The example latch 430 generates an output ($Q_1$). The example output of the latch 495 is connected to the example logic and driver circuitry 410.

Figure 5:
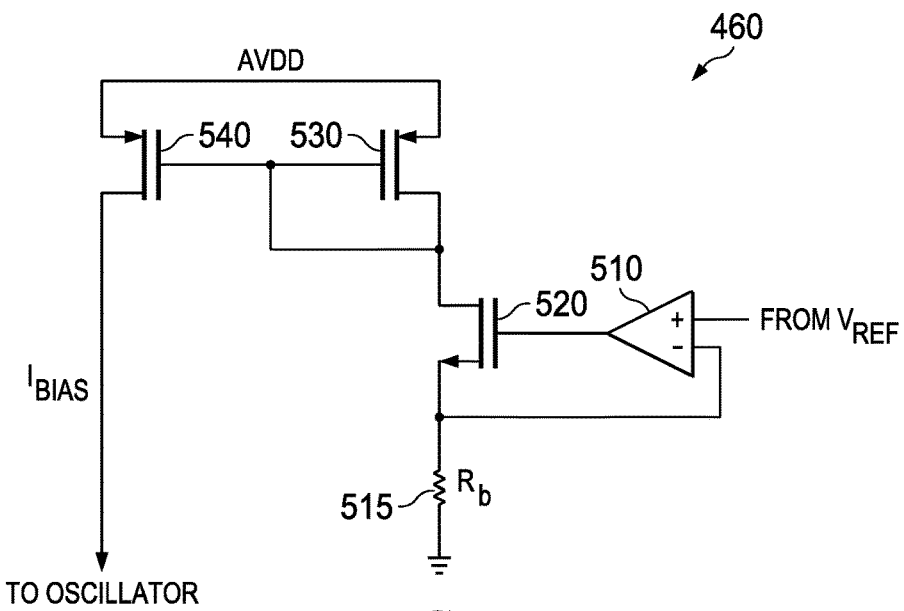
FIG. 5 is a circuit diagram representing an example implementation of the example synchronize and track circuit of FIG. 4.

FIG. 5 is a circuit diagram representing an example implementation of the example synchronize and track circuit 460 of FIG. 4. The example synchronize and track circuit 460 includes an amplifier 510, a resistor 515, a first transistor 520, a second transistor 530, and a third transistor 540.

A first input terminal of the example amplifier 510 receives the reference voltage 456. A second input terminal of the example amplifier 510 is connected to a first terminal of the first transistor 520 and a first terminal of the resistor 515. An output terminal of the example amplifier 510 is connected to a second terminal of the first transistor 520.

As noted above, the first terminal of the resistor 515 is connected to the first terminal of the first transistor 520 and a second input terminal of the example amplifier 510. A second terminal of the resistor 515 is connected to ground.

The first example transistor 520 of the illustrated example of FIG. 5 is implemented as an N-channel metal oxide semiconductor field effect transistor (MOSFET). However, any other transistor circuit may additionally or alternatively be used. The first terminal of the first example transistor 520 is connected to the first terminal of the resistor 515 and the second input terminal of the amplifier 510. The second terminal of the first example transistor 520 is connected to the output terminal of the amplifier 510. A third terminal is connected to a first terminal of the second transistor 530, a second terminal of the second transistor 530, and a first terminal of the third transistor 540. In the illustrated example of FIG. 5, the first terminal of the first example transistor 520 is a source terminal, the second terminal of the first example transistor 520 is a gate terminal, and the third terminal of the first example transistor 520 is a drain terminal. However, any other past, present, and/or future terminal naming convention may additionally or alternatively be used.

The example second transistor 530 of the illustrated example of FIG. 5 is implemented as a P-channel MOSFET. However, any other transistor circuit may additionally or alternatively be used. The first terminal of the second example transistor 530 is connected to the third terminal of the first transistor 520, the second terminal of the second example transistor 530, and the first terminal of the third example transistor 540. A third terminal of the second example transistor 530 is connected to a local supply AVDD. In the illustrated example of FIG. 5, the first terminal of the second example transistor 530 is a drain terminal, the second terminal of the second example transistor 530 is a gate terminal, and the third terminal of the second example transistor 530 is a source terminal. However, any other past, present, and/or future terminal naming convention may additionally or alternatively be used.

The example third transistor 540 of the illustrated example of FIG. 5 is implemented as a P-channel MOSFET. However, any other transistor circuit may additionally or alternatively be used. The first terminal is connected to the second terminal of the second example transistor 530, the first terminal of the second example transistor 530, and the third terminal of the first example transistor 520. The second terminal of the third example transistor 540 is connected to a local supply AVDD. The third terminal creates an output bias current ($I_{BIAS}$), which is output to the oscillator 465 of FIG. 4. Because the input reference voltage is a function of time, the synchronized and tracked current Ibias is also a function of time. In the illustrated example of FIG. 5, the first terminal of the third example transistor 540 is a gate terminal, the second terminal of the third example transistor 540 is a source terminal, and the third terminal of the third example transistor 540 is a drain terminal. However, any other past, present, and/or future terminal naming convention may additionally or alternatively be used.

Figure 6:
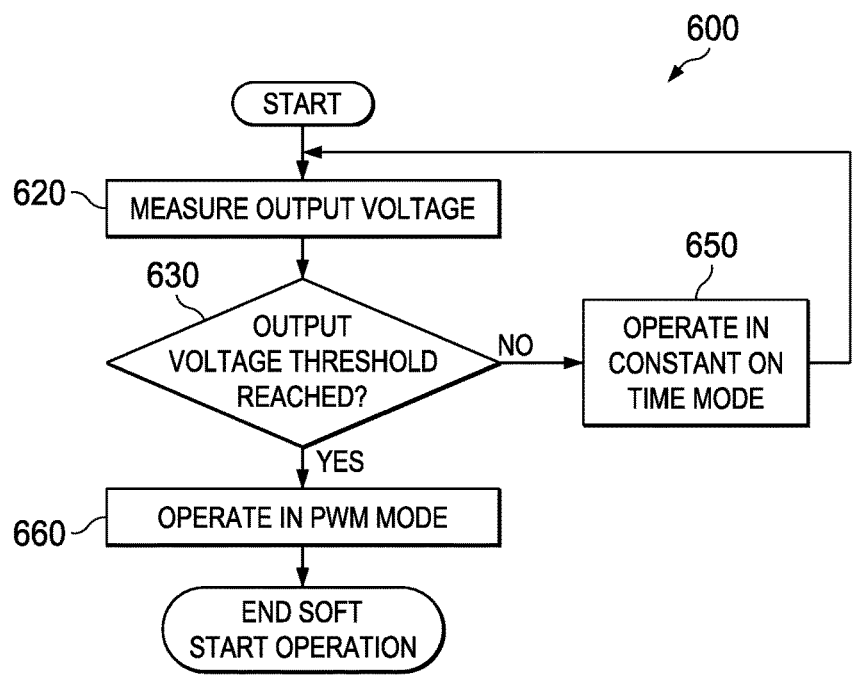
FIG. 6 is a flowchart representative of example process performed by the example mode selector of FIG. 4 to select a mode of operation.

FIG. 6 is a flowchart representative of example process 600 performed by the example mode selector 484 of FIG. 4 to select a mode of operation. The example process 600 of FIG. 6 begins when the divider 486 of FIG. 4 measures the output voltage 438 (Vout) (block 620). The example comparator 488 compares the scaled output voltage 438 (Vout) to a threshold (block 630). While in the illustrated example of FIG. 6, a voltage threshold is used, any other approach to determining when to switch from a first mode of operation to a second mode of operation may additionally or alternatively be used. For example, a time-based threshold (e.g., a counter value reaching a threshold) may be used to determine when to switch from the first mode of operation to the second mode of operation.

When the output voltage is below the threshold (block 630 returns a result of NO), the example comparator 488 determines that the DC-DC converter should operate in a constant on-time mode. The example comparator 488 outputs a value instructing the multiplexer 490 to select the inputs from the constant on-time circuit 482 of FIG. 4 (block 650). The output from the comparator 488 is also used by the logic and drivers circuitry 410 to control pulse shuffling and/or selection of pulses.

When the example comparator 488 determines that that the output voltage is above the threshold (block 630 returns a result of YES), the example comparator 488 outputs a value instructing the multiplexer to select the input(s) from the pulse width modulation control loop 470 (block 660). In some examples, the output from the comparator 488 is also used by the logic and drivers circuitry 410 to control pulse shuffling and/or selection of pulses (which is disabled during pulse width modulation mode). Use of the output of the mode selector to control pulse shuffling and/or selection of pulses is described in further detail in connection with the N-level implementation shown in FIGS. 8 and/or 9. Upon setting of the output such that the multiplexer 490 and the logic and drivers 410 operate in accordance with the pulse width modulation mode, the example comparator 488 ends the soft start operation. That is, the comparator 488 does not continually monitor the output voltage to determine whether to return to the constant on-time mode. However, in some examples, control may return to block 620 such that the comparator 488 determines whether to return to the constant on-time mode. The example process 600 of FIG. 6 is repeated upon a restart of the DC-DC converter 400.

Figure 7:
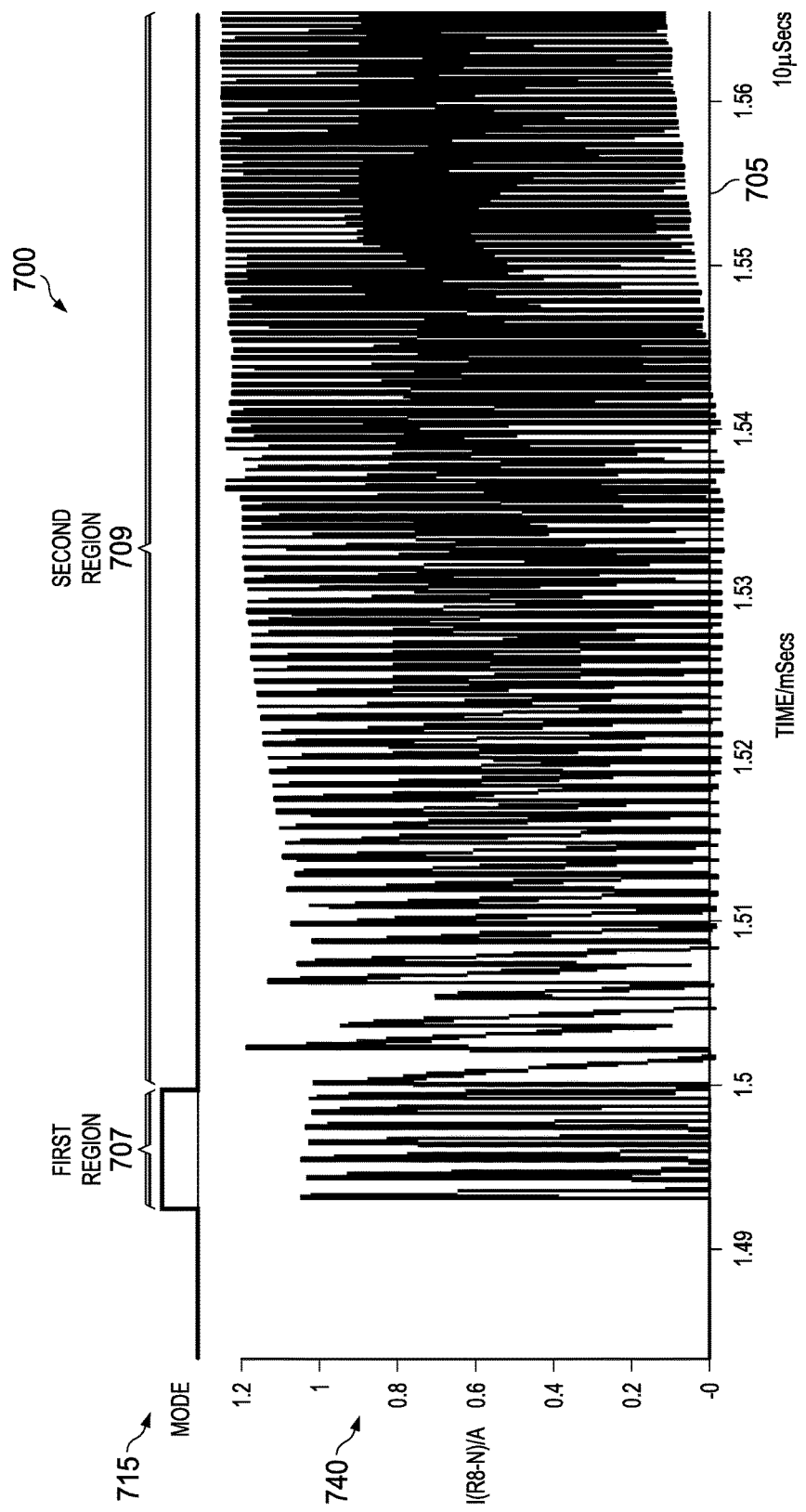
FIG. 7 is a timing diagram 700 representing an inductor current of the inductor 415 of the example DC-DC converter 400 of FIG. 4 during startup of the DC-DC converter 400.

FIG. 7 is a timing diagram 700 representing an inductor current of the inductor 415 of the example DC-DC converter 400 of FIG. 4 during startup of the DC-DC converter 400. The example timing diagram 700 includes a horizontal axis 705 representing time. The example timing diagram 700 displays two regions of operation: a first region 707 and a second region 709. During the first region 707, a mode of operation 715 of the DC-DC converter 400 (as selected by the example mode selector 484) is represented as a high signal. In the first region 707, the output voltage 438 is below the threshold (as determined by the mode selector 484) and the multiplexer 490 and logic and driver circuitry 410 operate in the constant on-time mode. During the second region 709, the multiplexer 490 and logic and driver circuitry 410 operate in pulse width modulation mode. In each of the modes, the synchronize and track circuit 460 synchronizes and references the output Ibias to the slope of the reference voltage 456 to increase the switching frequency of the oscillator 465 over time. In some examples, an error signal representing a difference between the reference voltage 456 and the output voltage 438 may additionally or alternatively be used to fine tune the switching frequency of the oscillator 465. FIG. 7 also illustrates an inductor current 740 of the inductor 415. In the illustrated example of FIG. 7, as a result of utilizing the example approaches disclosed herein, the inductor 415 does not experience a large inrush current (as compared to the inrush current 329 of FIG. 3). For example, during the constant on-time mode (represented by the first region 707), the inrush current peaks at approximately 1 Ampere. In some examples, the maximum inrush current is controlled by the amount of time used in the constant on-time mode (e.g., the duration of time controlled by the constant on-time generator 482). Using a longer on-time results in more time for inrush current to enter the inductor 415 (and consequently, larger maximum inrush currents), whereas using a shorter on-time results in less time for inrush current to enter the inductor 415 (and consequently, lower maximum inrush currents).

In the illustrated example of FIG. 7, a transition from the first example region 707 to the second example region 709 occurs at approximately 1.5 milliseconds, and corresponds to a point in time in which the mode selector 484 identifies that the output voltage 438 has reached a threshold value. Of course, other approaches may additionally or alternatively be used to identify when to transition from the first region 707 to the second region 709. In the second region 709 (the pulse width modulated mode), the on-time of the charging circuitry is dependent upon the error between the reference voltage 456 and the output voltage 438. Moreover, the switching frequency increases over time. For example, whereas a lower switching frequency is experienced between 1.5 milliseconds and 1.51 milliseconds in the illustrated example of FIG. 7, a higher switching frequency is experienced between 1.55 milliseconds and 1.56 milliseconds.

As described above in connection with FIGS. 4, 5, 6, and/or 7, the example system may be implemented as a two mode system where, in a first mode, transistors are pulsed using a constant on-time signal, and during a second mode, the transistors are pulsed using a pulse width modulated signal. In the illustrated examples of FIGS. 4, 5, 6, and/or 7, each mode is implemented as a two level, where the inductor receives two voltage levels at its input, VIN or ground. In some examples, the DC-DC converter 400 of FIG. 4 could be extended to use many additional modes and/or levels of operation.

Figure 8:
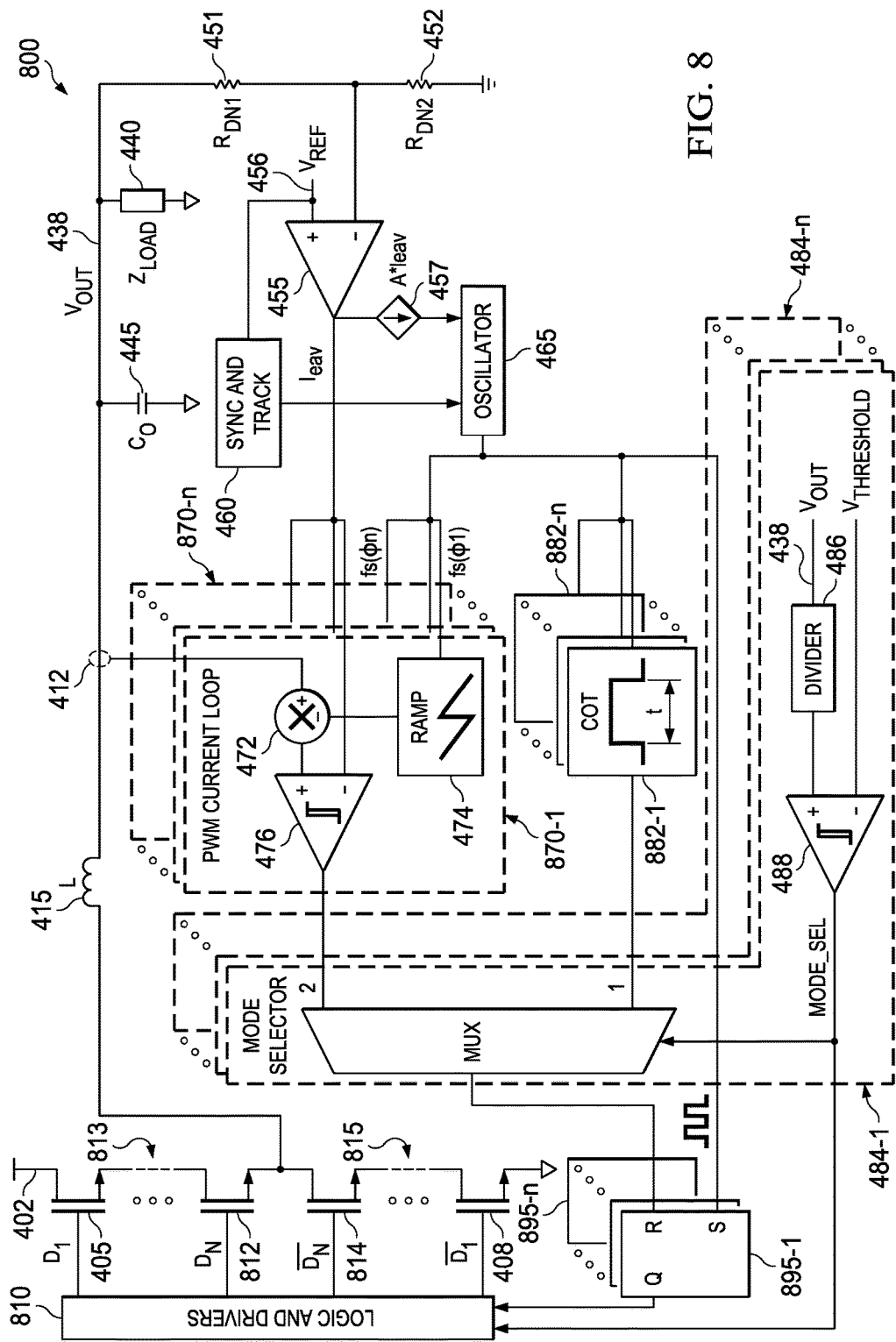
FIG. 8 is a circuit diagram of an example N level DC-DC converter providing a soft-start.

FIG. 8 is a circuit diagram of an example N level DC-DC converter 800 providing a soft-start. The example N level DC-DC converter 800 of FIG. 8 is different from the two level DC-DC converter 400 of FIG. 4 in that during each mode of operation, there are N pulses generated for controlling the switching of the transistors. In the illustrated example of FIG. 8, the example N level DC-DC converter 800 includes a third transistor 812, a fourth transistor 814, N pulse width modulation current loops 870, N constant on time generators 882, N multiplexers 890, and N latches 895. In some examples, additional intermediary transistors 813, 815 may be included to correspond to the N levels of the N level DC-DC converter 800. In some examples, additional modes of operation may be used.

In the illustrated example of FIG. 8, two additional transistors (the third transistor 812 and the fourth transistor 814) are shown. The third and fourth transistors 812, 814 represent a pair of transistors. When implementing the DC-DC converter 800 using N levels, (N−1) pairs of transistors are included. The example third and fourth transistors 812, 814 (and/or other intermediary transistors 813, 815) receive control signals $D_N$ and $\overline{D_N}$ from the logic and drivers 810.

In the illustrated example of FIG. 8, the third transistor 812 is implemented by an N-channel metal oxide semiconductor field effect transistor (MOSFET). However, any other type of transistor may additionally or alternatively be used. In the illustrated example of FIG. 8, a first terminal (e.g., a drain terminal) of the example third transistor 812 is connected to the third terminal (e.g., the source terminal) of the first example transistor 405 by any number of intermediary transistors 813. In the illustrated example of FIG. 8, a second terminal (e.g., a source terminal) of the third example transistor 812 is connected to the inductor 415. In examples disclosed herein, intermediary transistors 813 corresponding to the N levels implemented by the N level DC-DC converter of FIG. 8 are placed in series intermediate the first example transistor 405 and the third example transistor 812.

The example fourth transistor 814 of the illustrated example of FIG. 8 is implemented by an N-channel MOSFET. However, any other type of transistor may additionally or alternatively be used. In the illustrated example of FIG. 8, a first terminal (e.g., a drain terminal) of the fourth example transistor 814 is connected to the inductor 415. In the illustrated example of FIG. 8, a second terminal (e.g., a source terminal) of the fourth example transistor 814 is connected to the second example transistor 408 by any number of intermediary transistors 815. In examples disclosed herein, intermediary transistors 815 corresponding to the N levels implemented by the N level DC-DC converter 800 of FIG. 8 are placed in series intermediate the second example transistor 408 and the fourth example transistor 814.

The example DC-DC converter 800 of FIG. 8 includes N PWM current loops 870. Each of the PWM current loops 870 receives an input signal oscillating at a frequency Fs from the oscillator 465. In the illustrated example of FIG. 8, the inputs are phase shifted. In examples disclosed herein, the phase shift corresponds to the number of levels (e.g., N). For example, in a three level DC-DC converter, the input signals will be phase shifted by 0° and 180°. However, any other phase shift may additionally or alternatively be used. In examples disclosed herein, the outputs of the N PWM current loops 870 are passed to a corresponding multiplexer of the N multiplexers 890. As a result of the phase shift, pulses are distributed more evenly. Consequently, shorter pulse widths may be used to control peak inrush currents experienced at the inductor 415.

The example DC-DC converter 800 of FIG. 8 includes N constant on-time generators 882. Each of the constant on-time generators 882 receive the phase shifted input signal(s) output by the oscillator 465. The example constant on-time generators 882 generate pulses having a constant pulse width. In examples disclosed herein, the pulse width may be decreased as the number of levels (e.g., N) increases. Those pulses are each passed to a corresponding multiplexer of the N multiplexers 890. In examples disclosed herein, the output of the $N^{th}$ constant on-time generator is passed to the same multiplexer as the output of the $N^{th}$ PWM current loop.

The multiplexers 890 select between input signals received from the corresponding constant on-time generator or the corresponding PWM current loop based on a mode selection signal received from the second comparator 488. The example multiplexers 890 pass the selected outputs to a corresponding latch 895.

The example DC-DC converter 800 of FIG. 8 includes N latches 895. Each of the N latches 895 are reset based on the signal received from the corresponding multiplexer, and are set based on the corresponding phase shifted input signals (as received from the oscillator 465). The example N latches 895 output signals $Q_1 \ldots Q_N$ to the logic and drivers 810.

Figure 9:
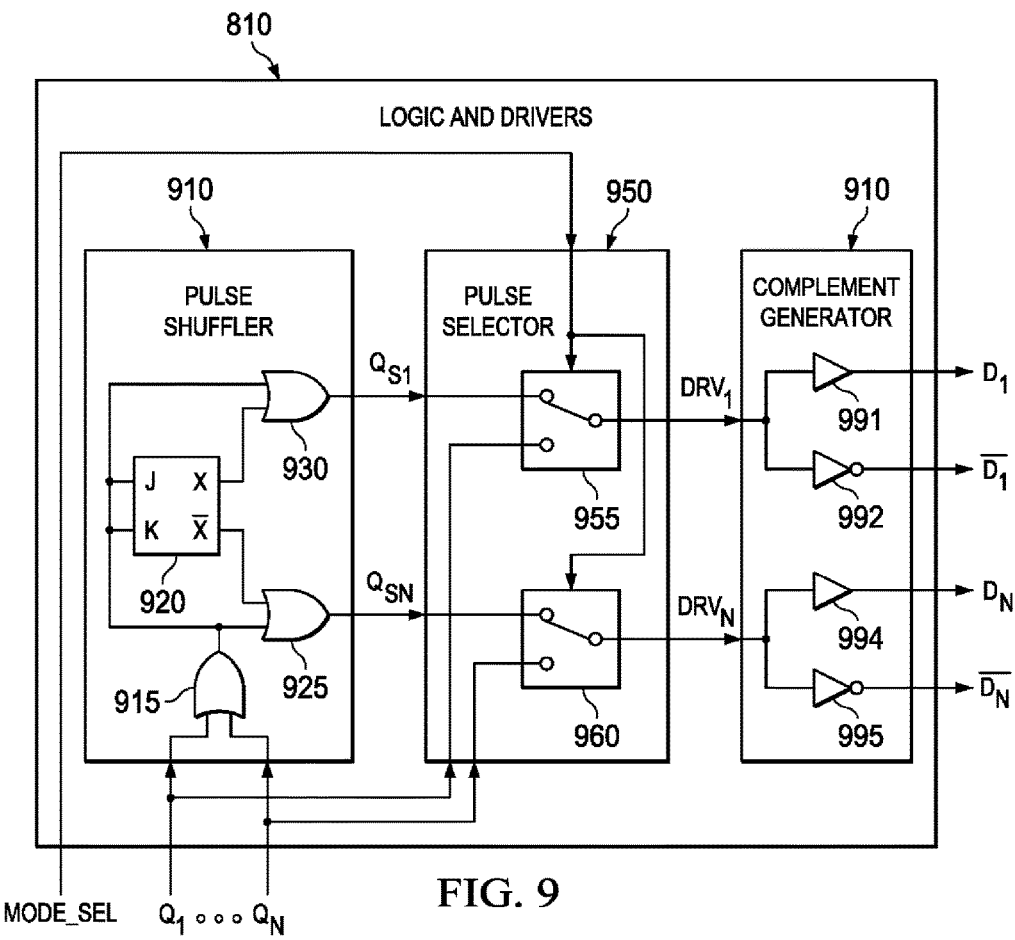
FIG. 9 is a block diagram representing an example implementation of the example logic and driver circuitry of FIG. 8.

FIG. 9 is a block diagram representing an example implementation of the example logic and drivers circuitry 810 of FIG. 8, when implemented to use N levels. The example logic and drivers circuitry 810 of the illustrated example of FIG. 9 includes a pulse shuffler 910, a pulse selector 950, and a complement generator 990. The example pulse shuffler 910 of the illustrated example of FIG. 9 includes an OR gate 915, a flip-flop 920, a first AND gate 925, and a second AND gate 930. The example pulse selector 950 the illustrated example of FIG. 9 includes a first switch 955 and a second switch 960.

Figure 10:
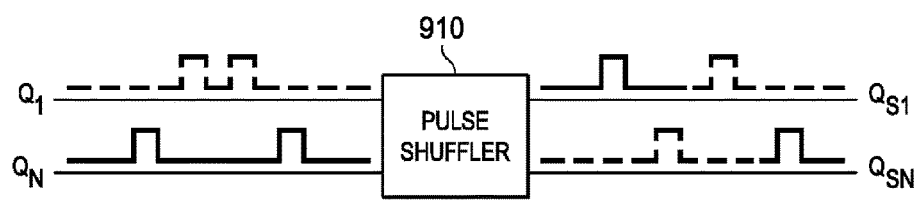
FIG. 10 is a block diagram representing example inputs and outputs of the example pulse shuffler of FIG. 9.

The example pulse shuffler 910 shuffles pulses received from the latches 895. The shuffling performed by the pulse shuffler 910 ensures that there is uniform switching between the outputs $D_1$ and $D_N$ of the example logic and drivers circuitry 810. In the illustrated example of FIG. 9, no consecutive pulses on a single output are allowed without an intermediary pulse on another output. FIG. 10 is a block diagram representing example inputs and outputs of the example pulse shuffler 910 of FIG. 9. As shown in the illustrated example of FIG. 10, the pulse shuffler 910 receives an input $Q_1$ and an input $Q_N$. The input $Q_1$ has two consecutive pulses that are intermediate the pulses of $Q_N$. When creating outputs $Q_{S1}$ and $Q_{SN}$, the example pulse shuffler 910 toggles between which output is pulsed.

Returning to FIG. 9, the example OR gate 915 of the example pulse shuffler receives the inputs $Q_1$ and $Q_N$. The example OR gate 915 outputs a logical OR of $Q_1 \ldots Q_N$ (represented further herein as: $Q_1|Q_N$). The output $Q_1|Q_N$ is input to the flip-flop 920, a first input terminal of the first AND gate 925, and a first input terminal of the second AND gate 930. In the illustrated example of FIG. 9, the flip-flop 920 is a JK flip flop that toggles the outputs X and $\overline{X}$ when $Q_1|Q_N$ is true. The output X of the flip-flop 920 is connected to a second input of the second AND gate 930. The output $\overline{X}$ of the flip-flop 920 is connected to a second input of the first AND gate 925. The second example AND gate 930 outputs the logical AND of X and $Q_1|Q_N$ as a shuffled output $Q_{S1}$. The first example AND gate 925 outputs the logical AND of $\overline{X}$ and $Q_1|Q_N$ as a shuffled output $Q_{SN}$. As a result, the pulse widths and timings of $Q_1$ and $Q_N$ are maintained, but conform to the rule that no consecutive pulses on a single output are allowed without an intermediary pulse on the other output.

The example pulse selector 950 of the illustrated example of FIG. 9 includes a first switch 955 and a second switch 960. In some examples, additional switches may be used corresponding to the N levels of the N level DC-DC converter. The first switch 955 is a single pole double throw switch. Likewise, the second switch 960 is a single pole double throw switch. However, any other type of switch and/or switching topology may additionally or alternatively be used. The first example switch 955 selects between $Q_1$ and $Q_{S1}$ for routing to the output $DRV_1$. The second example switch 960 selects between $Q_N$ and $Q_{SN}$ for routing to the output $DRV_N$. When the mode selector 484 indicates that the logic and drivers circuitry 810 is to operate in the first mode, the first and second switches 955 and 960 select $Q_{S1}$ and $Q_{SN}$, respectively. When the mode selector 484 indicates that the logic and drivers circuitry 810 is to operate in the second mode, the first and second switches 955 and 960 select $Q_1$ and $Q_N$, respectively.

The example signals $DRV_1$ through $DRV_N$ are passed to the complement generator 990. The example complement generator 990 outputs signals $D_1$ through $D_N$, as well as complements of those signals $\overline{D_1}$ through $\overline{D_N}$. The example complement generator 990 includes a pair of logic devices for each of $DRV_1$ through $DRV_N$. In the illustrated example of FIG. 9, a first pair of logic devices includes a first logic buffer 991 and a first inverter 992. In the illustrated example of FIG. 9, a second pair of logic devices includes a second logic buffer 994 and a second inverter 995. The example logic devices 991, 992, 994, 995 ensure that the corresponding DRV signals are set to levels appropriate for driving the first example transistor 405, the second example transistor 408, the third example transistor 812, and the fourth example transistor 815 of FIG. 8.

From the foregoing, it will be appreciated that the above disclosed methods, apparatus and articles of manufacture enable soft-start control in a DC-DC converter, while also offering a solution to common startup problems found in Multi-level DC-DC converter architectures.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A DC-DC voltage converter comprising:
   at least first and second transistors to charge or discharge an inductor, the inductor to output an output voltage;
   a synchronize and track circuit to generate a bias current based on a reference voltage;
   an amplifier to generate an error current based on the output voltage and the reference voltage;
   an oscillator to oscillate at a switching frequency based on the bias current and the error current;
   at least one latch to generate at least first and second control signals based on a reset signal and the switching frequency;
   a pulse shuffler to generate at least first and second shuffled control signals based on the first and second control signals, so as to prevent consecutive pulses from occurring in the first shuffled control signal without an intermediary pulse in the second shuffled control signal; and
   a pulse selector to: in a first mode, provide the first and second shuffled control signals to the first and second transistors respectively; and, in a second mode, provide the first and second control signals to the first and second transistors respectively.

2. The DC-DC voltage converter of claim 1, further comprising a multiplexer to select between: a first input signal for output as the reset signal, the first input signal being generated by a constant on-time generator based on the switching frequency; and a second input signal for output as the reset signal, the second input signal being generated based on the switching frequency and a current of the inductor.

3. The DC-DC voltage converter of claim 2, wherein the constant on-time generator, when operated at the switching frequency, limits an inrush current of the inductor.

4. The DC-DC voltage converter of claim 1, further comprising a multiplexer to select between: a first input signal for output as the reset signal, the first input signal being generated based on the switching frequency; and a second input signal for output as the reset signal, the second input signal being generated by a pulse width modulation current loop based on the switching frequency and a current of the inductor.

5. The DC-DC voltage converter of claim 4, wherein the pulse width modulation current loop includes a ramp generator and a comparator, the comparator to output the second input signal based on a comparison of the error current and the ramp generator.

6. The DC-DC voltage converter of claim 5, wherein the ramp generator operates based on the switching frequency.

7. The DC-DC voltage converter of claim 1, further comprising:
   a multiplexer to select between: a first input signal for output as the reset signal, the first input signal being generated based on the switching frequency; and a second input signal for output as the reset signal, the second input signal being generated based on the switching frequency and a current of the inductor; and
   a mode selector to control the selection performed by the multiplexer, wherein the multiplexer is to select: the first input signal for output as the reset signal when the output voltage is below a voltage threshold; and the second input signal for output as the reset signal when the output voltage is greater than or equal to the voltage threshold.

8. The DC-DC voltage converter of claim 1, wherein the latch is an SR latch.

9. A circuit comprising:
   an oscillator to generate a switching signal oscillating at a switching frequency based on an output voltage of an inductor and a reference voltage;
   a constant on-time generator to generate a fixed-width pulse at the switching frequency;
   at least one set-reset latch to be set using the switching signal and reset using the fixed-width pulse, the set-reset latch to generate at least first and second control signals;
   a pulse shuffler to generate at least first and second shuffled control signals based on the first and second control signals, so as to prevent consecutive pulses from occurring in the first shuffled control signal without an intermediary pulse in the second shuffled control signal; and
   a pulse selector to: in a first mode, provide the first shuffled control signal to a transistor to charge or discharge the inductor; and, in a second mode, provide the first control signal to the transistor to charge or discharge the inductor.

10. The circuit of claim 9, wherein the transistor is a first transistor, and the circuit further includes a complement generator to generate a complement of the first control signal or the first shuffled control signal, wherein:
    in the first mode, the first transistor is to source voltage to the inductor when the first shuffled control signal represents a particular logical state, and a second transistor is to sink voltage from the inductor when the complement of the first shuffled control signal represents the particular logical state; and
    in the second mode, the first transistor is to source voltage to the inductor when the first control signal represents the particular logical state, and the second transistor is to sink voltage from the inductor when the complement of the first control signal represents the particular logical state.

11. The circuit of claim 9, wherein the reference voltage is to increase over time.

12. A DC-DC voltage converter comprising:
    a mode selector to determine whether to operate in a first mode or a second mode;
    a pulse shuffler to modify a first control signal received from a first latch and a second control signal received from a second latch to create a first shuffled control signal and a second shuffled control signal, the modifying to prevent consecutive pulses from occurring in the first shuffled control signal without an intermediary pulse in the second shuffled control signal; and
    a pulse selector to access a mode selection signal from the mode selector, the pulse selector to, when in the first mode, provide the first shuffled control signal to a transistor, the pulse selector to, when in the second mode, provide the first control signal to the transistor.

13. The DC-DC voltage converter of claim 12, wherein the mode selector is to determine whether to operate in the first mode or the second mode based on a comparison of an output voltage to a voltage threshold.

14. The DC-DC voltage converter of claim 12, further including a tracking circuit to provide a bias current to an oscillator, the oscillator to provide a clock signal to a current control loop.

15. The DC-DC voltage converter of claim 14, wherein the bias current is based on a reference voltage.

16. The DC-DC voltage converter of claim 12, wherein the transistor is a first transistor, and the pulse selector is further to, when in the first mode, provide the second shuffled control signal to a second transistor, and, when in the second mode, provide the second control signal to the second transistor.

* * * * *